United States Patent [19]

Frazier

[11] Patent Number: 5,521,862
[45] Date of Patent: May 28, 1996

[54] APPARATUS AND METHOD FOR STORING INFORMATION IN MAGNETIC FIELDS

[75] Inventor: Gary A. Frazier, Garland, Tex.

[73] Assignee: Texas Instruments Incorporated, Dallas, Tex.

[21] Appl. No.: 150,561

[22] Filed: Nov. 10, 1993

Related U.S. Application Data

[63] Continuation of Ser. No. 631,566, Dec. 21, 1990, abandoned.

[51] Int. Cl.⁶ .......................... G11C 11/44; H01L 29/06
[52] U.S. Cl. ..................... 365/160; 365/161; 257/38; 257/39
[58] Field of Search .................. 365/160, 161, 365/162; 357/4, 5; 505/831–833, 841, 701, 703; 257/593, 517, 198, 587, 38, 39, 161

[56] References Cited

U.S. PATENT DOCUMENTS

| | | | |
|---|---|---|---|
| 3,381,280 | 4/1968 | Hagedorn | 365/160 |
| 3,500,344 | 3/1970 | Lacroix | 365/160 |
| 3,750,153 | 7/1973 | Testardi | 365/160 |
| 4,831,427 | 5/1989 | Coleman, Jr. | 357/27 |
| 4,920,512 | 4/1990 | Miyamoto | 357/23.5 |
| 5,024,993 | 6/1991 | Kroger et al. | 357/5 X |
| 5,039,656 | 8/1991 | Hidaka | 505/1 |
| 5,041,880 | 8/1991 | Nojima et al. | 365/160 X |
| 5,051,787 | 9/1991 | Hasegawa | 357/5 |
| 5,070,070 | 12/1991 | Askew et al. | 365/160 X |

FOREIGN PATENT DOCUMENTS

| | | | |
|---|---|---|---|
| 0327121 | 8/1989 | European Pat. Off. | 357/5 |
| 2434727 | 4/1975 | Germany | 365/160 |
| 0000391 | 1/1990 | Japan | 357/5 |
| 0056930 | 2/1990 | Japan | 505/703 |

*Primary Examiner*—David C. Nelms
*Assistant Examiner*—Son Dinh
*Attorney, Agent, or Firm*—Carlton H. Hoel; W. James Bradly, III; Richard L. Donaldson

[57] ABSTRACT

A magnetic memory cell 10 is provided, which includes a layer 12 of superconducting material. A current path 22 is formed insulatively adjacent layer 12 of superconducting material, such that a current passed through current path 22 induces a magnetic field of a selected magnitude and selected orientation in layer 12 of superconducting material.

23 Claims, 2 Drawing Sheets

APPARATUS AND METHOD FOR STORING INFORMATION IN MAGNETIC FIELDS

This application is a Continuation of application Ser. No. 07/631,566, filed Dec. 21, 1990, now abandoned.

TECHNICAL FIELD OF THE INVENTION

The present invention relates in general to memory devices, and more particularly, to methods and apparatus for storing information in magnetic fields.

BACKGROUND OF THE INVENTION

Non-volatile memories retain their stored information after their power supply has been turned off, and have many applications in digital information systems, control apparatus, and other electronic systems. Although several forms of non-volatile memories exist, each has serious shortcomings.

Over the last twenty years, much work has been performed developing magnetic bubble memories. However, bubble memories remain complex, and require large current drive for their operation. Additionally, the cost of bubble memory greatly exceeds that of other memory devices.

EPROMs and EEPROMs are capable of retaining information over extended periods of time without losing data, but the charge, and therefore the data, within an EPROM or a EEPROM will eventually be lost by thermally induced tunneling or leakage. Further, changing the information stored in an EPROM or a EEPROM cannot be performed rapidly. Static RAMs and dynamic RAMs while volatile, can be maintained by a battery during periods when the system power is turned off. However, batteries have a relatively short useful life, and thereby present the danger of losing valued information as the batteries become discharged.

While important strides have been made in improving the storage capacity of random access memories, it is still desirable to increase the storage capacities further, especially in non-volatile memories.

One potential solution to solving capacity problems in non-volatile devices is through the use of ferromagnetic gates. Such a ferromagnetic gate memory is disclosed in U.S. Pat. No. 4,931,428, assigned to the Assignee of the present application, which is incorporated by reference herein. The disclosed device is essentially a field effect transistor having a sheet of ferromagnetic material for its gate. The ferromagnetic material is electrically conductive such that an inversion layer can be created in the underlying channel of the field effect transistor, allowing current to flow between the pair of source/drain regions of the transistor. By passing current through the channel in a selected direction, a magnetic field is induced in the ferromagnetic gate having a specific orientation. Depending on the orientation and strength of the magnetic field, the current through the channel can be controlled through the deflection of electrons into and out of the higher resistance channel surface.

This device, however, has a relatively small modulation of resistance. By increasing the modulation of resistance, the sensing circuitry could be simplified, reducing the cost of the memory.

Thus, a need has arisen in the industry for a fast, non-volatile memory cell, having a high storage capacity and with an increased modulation of resistance.

SUMMARY OF THE INVENTION

According to the invention, a magnetic memory cell is provided which includes a layer of superconducting material. A current path is formed insulatively adjacent the layer of superconducting material and is operable to induce a magnetic field of selected orientation in the layer of superconducting material.

According to other aspects of the invention, a method is provided for programming information into the magnetic memory cell by selectively creating an oriented magnetic field in the layer of superconductor. The layer of superconductor is heated above its transition temperature to erase any residual magnetic field therein. The superconducting layer is next cooled below its transition temperature and then a current is passed through the current path adjacent the layer of superconductor to induce a magnetic field in the superconductor layer.

The present invention provides distinct advantages over prior art devices. In the present invention, a substantially larger range of resistance modulation can be obtained. Further, because superconductors can be completely erased of residual magnetic field, the present invention does not suffer from hysteresis effects found in conventional magnetic materials. Finally, because the magnetic and electric fields can be maintained for long periods of time, at the proper temperature, the present invention will allow the storage of data without loss for significant periods of time.

BRIEF DESCRIPTION OF THE DRAWINGS

For a more and complete understanding of the present invention and the advantages thereof, reference is now made to the following description taken in conjunction with the accompanying drawings in which.

DETAILED DESCRIPTION OF THE INVENTION

Figure 1:
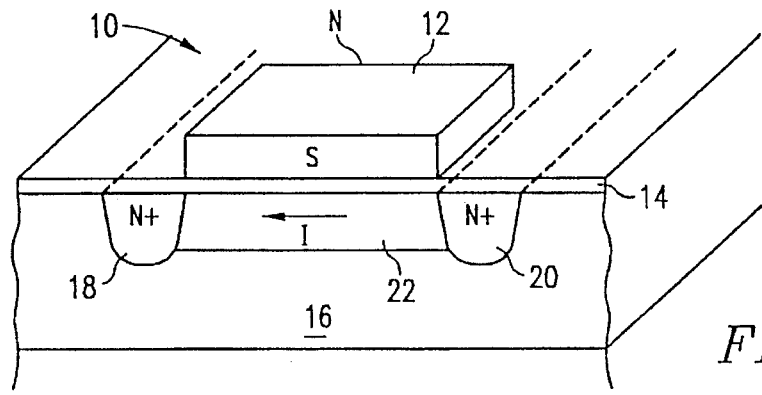
FIG. 1 illustrates a perspective view of a memory cell storing information in a layer of superconducting material.

FIG. 1 illustrates a perspective view of a magnetic memory cell having a superconducting gate. The superconducting gate memory cell (hereinafter "memory cell") 10 comprises a gate 12 formed from a layer of superconducting material. A thin insulating layer 14 separates the gate 12 from the substrate 16. Two n+ regions serve as the source 18 and drain 20 of the memory cell; for illustration purposes, the regions will be denoted as source 18 and drain 20, although the actual configuration of source and drain will depend upon the voltages applied to each region. An inversion layer is created in channel are 22 of substrate 16 when a voltage resides on the gate 12. A current between the source 18 and drain 20 is illustrated by the reference character "I".

Preferably, superconducting gate 12 is formed from a superconducting material having a high transition temperature and a high magnetic field critical value. The transition temperature $T_c$ is the point below which the material must be cooled before superconductivity is obtained. The magnetic field critical value is the point where a magnetic field in or near the superconductor drives the material out of superconductivity. Examples of such high temperature superconducting materials include complex metal oxides containing rare earth elements which may have transition temperatures around 90° K. and ceramics such as $Tl_2Ba_2Ca_2Cu_2O_{10}$, which has a transition temperature of around 125° K. Such superconducting materials have the significant advantage of retaining a magnetic field, as long as the materials stay below the transition temperature and are not subjected to magnetic fields greater than the magnetic field critical value.

The remaining aspects of the memory cell 10 are similar to those found in conventional field effect transistors. For example, source and drain regions 18 and 20 may be formed by defusing n+ regions into a p-type substrate.

Information is written into or stored in the memory cell 10 by creating a local magnetic field in the gate. To create the local magnetic field, the residual flux on the gate 12 is erased. To erase the gate, the temperature of superconducting gate 12 is brought below the transition temperature of the superconducting material composing it. An electric field is then induced in gate 12, such that gate 12 acts like the gate in a conventional field effect transistor, to create an inversion layer in channel area 22. The inversion layer allows a current to be passed between n+ source/drain regions 18 and 20. Due to the resistance in channel area 22, the current flow will cause the temperature of superconducting gate 12 to rise above the transition temperature $T_c$ of the superconducting material. Once the transition temperature $T_c$ has been exceeded, gate 12 no longer acts as a superconductor and all magnetism in gate 12 disappears, essentially erasing any residual magnetic flux.

Information can be then written into gate 12 by reducing the current flowing between n+ source/drain regions 18 and 20 to a new steady state value. As the current through channel 22 is decreased, and the heat being generated by the channel resistance is decreased, the temperature of gate 12 will again fall below the transition temperature $T_c$ and gate 12 will again become superconducting. At the point gate 12 regains superconductivity, a magnetic field will be "written" into memory call 10. The direction of the current flow will determine the orientation of the magnetic field written into gate 12. The orientation of the magnetic field may be used to determine if, for example, memory cell 10 represents a logic "1" or a logic "0" as will be described in more detail below. Further, the magnitude of the current flowing in channel area 22 will determine the magnitude of the magnetic field induced onto superconducting gate 12. This will allow the magnetic field induced on gate 12 to be modulated from 0 value up to the magnetic field critical value, as determined by the superconducting material. The ability to modulate the magnetic field consequently allows a modulation of the conductivity of the underlying channel area 22.

The use of a gate 12, which behaves as a normal conductor above temperature $T_c$ and a superconductor below temperature $T_c$, presents a distinct advantage. Conventional magnetic films are limited by hysteresis effects in that they have a memory for magnetic energy, such that they magnetize in relationship to one field and demagnetize in terms of another. Hysteresis effects can make the controlling of the magnetic field in a conventional magnetic material difficult. These hysteresis effects are eliminated with the use of a superconducting gate. When the temperature of superconducting gate 12 is brought above temperature $T_c$, the magnetic field residing in gate 12 is completely eliminated, leaving no residual magnetic field which may cause hysteresis.

The range of modulation of the magnetic field induced on superconducting gate 12 can be increased by forming gate 12 as a thin film and having a deep channel 22. A deep channel 22 allows a greater current flow between source/drain regions 18 through 20. Stronger currents allow a stronger magnetic field to be induced in gate 12.

Figure 2A:
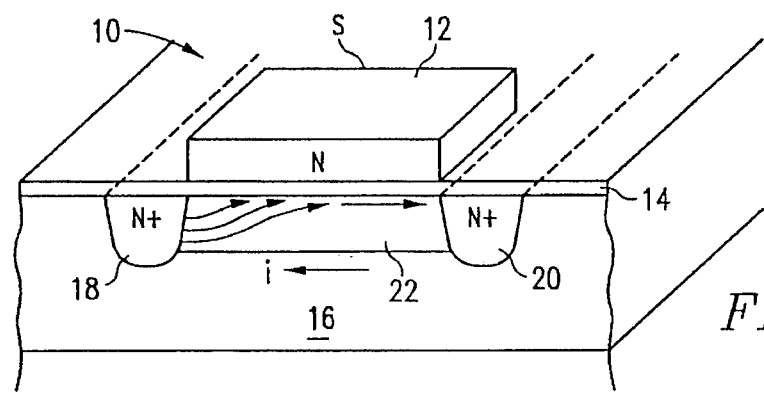
FIGS. 2a–b illustrates a perspective view of the memory cell of FIG. 1 during a read operation.
Figure 2B:
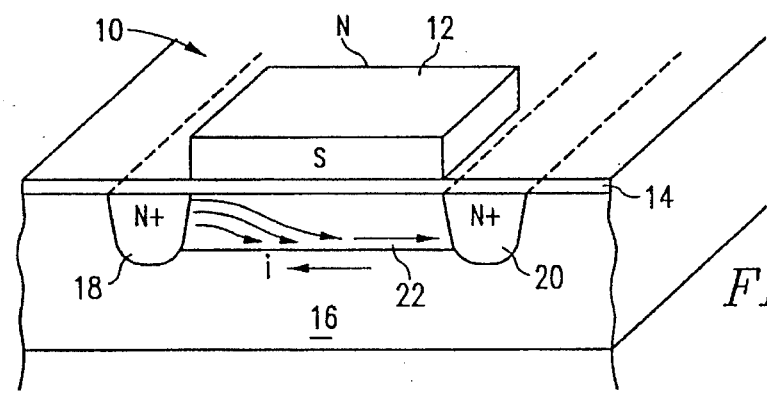

FIGS. 2a–b illustrate the memory cell of FIG. 1 during a "read" operation. In FIG. 2a, a magnetic orientation on the gate 12 is such that the front of the ferromagnetic gate 12 has a north pole, and the back of the gate 12 has a south pole, as illustrated by reference characters N and S. This north/south orientation would be created by a large electron flux passing from drain 20 to source 18.

To read information from the memory cell 10, a small electron flux creating a current "i" is passed from source 18 to drain 20 as a result of a voltage between the source 18 and a drain 20. With the magnetic orientation illustrated in FIG. 2a, electrons passing from source 18 to drain 20 will flow substantially along the substrate surface.

As will be discussed in more detail in connection with FIG. 3, the mobility of the electrons travelling at the surface of the substrate 16 will be impeded, due to natural surface scattering mechanisms. Consequently, the flow of electrons from source 18 to drain 20 will be impeded and reduced by the magnetic field illustrated in FIG. 2a due to surface scattering effects.

FIG. 2b illustrates a perspective view of the memory cell 10 during a read operation in which the ferromagnetic gate has a magnetic field orientation opposite to that of FIG. 2a. This magnetic field orientation could be created by passing a large electron flux from source 18 to drain 20 as illustrated in FIG. 1.

Once again, a small predetermined voltage is generated between source 18 to drain 20 in order to perform a read operation. In this instance, the magnetic field present on gate 12 pushes electrons in the resultant current towards the bottom of the channel 22. The bottom of the channel 22, being in the bulk of the substrate 16, does not impede the flow of electrons to the degree exhibited by the surface of the substrate 16. Hence, in response to an applied voltage, a larger current will pass between source 18 and drain 20 with the gate 12 having the magnetic orientations specified in FIG. 2b than with the gate 12 having the magnetic orientations specified in FIG. 2a. This difference in current level may thus be detected to read either a logic "1" or "0" stored in the cell 10. Suitable current level detection circuitry may be coupled to the cell to detect the difference between the logic "1" and logic "0" conductive states.

Figure 3:
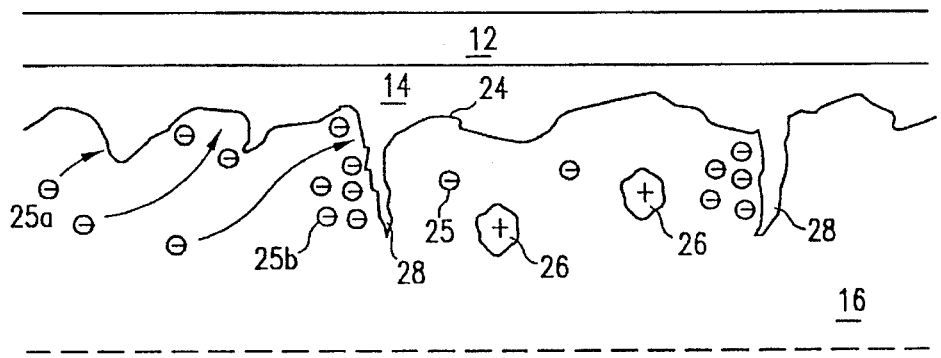
FIG. 3 illustrates the surface scattering effects inherent in a magnetic orientation forcing electrons towards the substrate surface.

FIG. 3 illustrates a mechanism by which the mobility of the electrons in FIG. 2a is reduced. FIG. 3 illustrates a cross-section of the gate 12, insulating layer 14, and substrate 16. The surface 24 of the substrate 16 will be irregular, impeding movement of the electrons 25 at the surface 24 as illustrated by impeded electrons 25a. Also, impurities 26, which may be added to the area just below the surface 24, will further deflect the electrons 25 away from a straight path between source 18 and drain 20. By roughening the surface 24, by means such as laser treatment or other deliberate etching/lithography mechanisms, crevices 28 may be formed which will further immobilize electrons 25b near the surface 24. While some irregularities may exist at the bottom of the channel 22, their number will not be nearly as great in magnitude, and thus their effect on the magnitude of the current will be much less.

Figure 4:
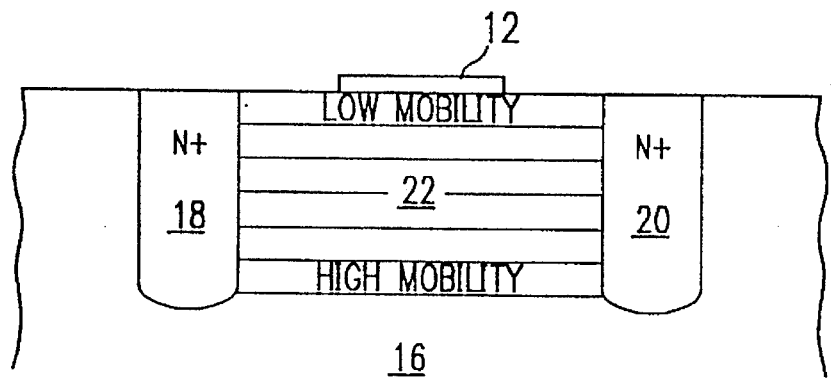
FIG. 4 illustrates an alternate embodiment in which a graded mobility current path is provided by a heterostructure.

By further reducing the mobility of the electrons by controlled fracturing of the surface and adding impurities, the differential between a current travelling at the surface 24 of the substrate 16 and a current travelling at the bottom of the channel 22 can be made even greater. Other techniques are available for reducing mobility of electrons at the surface, such as providing an amorphous layer at the surface 24. Alternatively, the substrate could be made of a substance having much higher mobility, such as InSb, which will proportionally affect the difference in mobility, facilitating reading of the information. Finally, further alternative is depicted in FIG. 4, which is a heterostructure providing a channel 22 with graded electron mobility. Successive layers of semiconducting materials having varying electron mobilities may be formed such that the electron mobility increases directly with the separation from gate 12. The structure shown in FIG. 4 can be formed using silicon and gallium arsenide technologies by known techniques such as molecular beam epitaxy.

Figure 5:
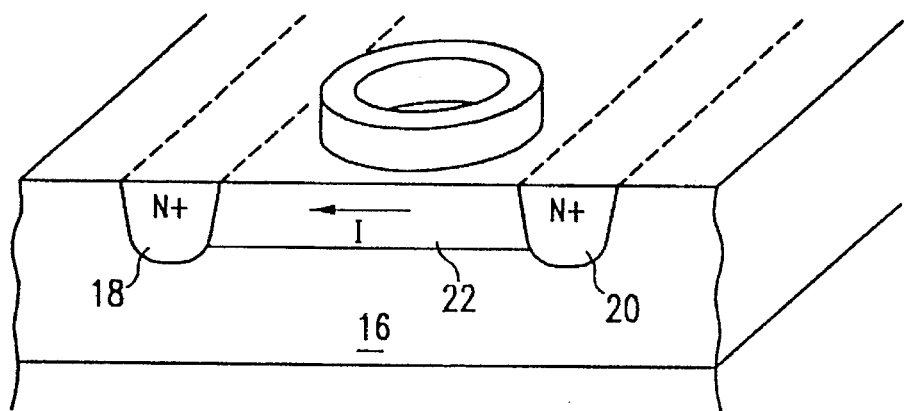
FIG. 5 illustrates a perspective view of a preferred embodiment of the memory cell of FIG. 1 having the layer of superconducting material disposed as a ring.

Referring next to FIG. 5, an alternate embodiment is depicted in which gate 12 is configured in a ring. In this embodiment, the magnetic field induced on gate 12, and consequently the conductivity of channel area 22, can be stepped by discrete values allowing step-like modulation of the channel resistance. It is known in the art that the physical configuration of a structure can control the magnetic field which may be stored therein. By using a ring structure for gate 12, the current flowing through channel 22 must magnetize superconducting gate 12 in quantized steps. The quantum of magnetic field created in ring superconducting gate 12 in turn modulates the conductivity (or alternatively, the resistance) of channel 22. The stepped modulation of the channel conductivity allows this embodiment to be used in applications requiring stepped resistances, such as in neural networks and analog to digital converter resistive ladders.

Figure 6:
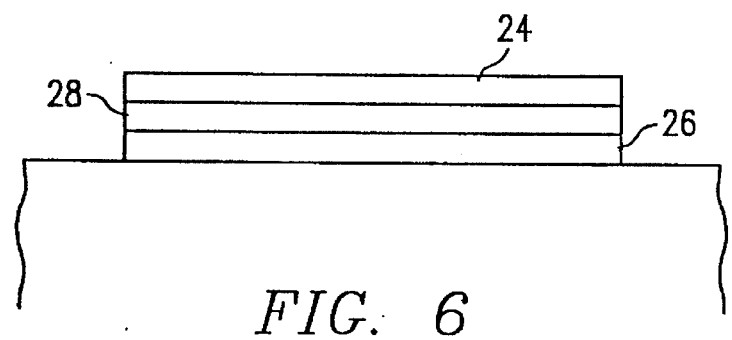
FIG. 6 is a cross-sectional elevational view of an alternate embodiment of the present invention, using a pair of layers of superconducting material.

Referring next to FIG. 6, a further embodiment is depicted in which the conductance of a layer of superconductor is modulated rather than the channel of a field effect transistor. In this embodiment, a first layer 24 of superconductor is formed insulatively adjacent a second layer 26 of superconductor. Layers 24 and 26 are spaced by a insulating layer 28. A current flow is created through first layer 24 until its critical current reaches a level at which the first layer 24 goes out of the superconducting state, becoming a conventional conductor. At this point, first layer 24 becomes resistive, generating heat. The heat in turn causes second superconductor layer 26 to fall out of superconductivity, thereby causing any residual magnetic field therein to vanish. The current through first layer 24 is then reduced to reduce the resistive heat being generated. When second layer 26 sufficiently cools, it returns to its superconducting state, and the new lower current through first layer 24 induces a magnetic field therein. If the magnetic field induced in superconducting layer 26 is maintained above the magnetic field critical value of superconducting layer 24, superconducting layer 24 will be subsequently kept out of the superconductivity state, even if layer 24 is allowed to cool. If the magnetic field induced in layer 26, however, is kept below the magnetic field critical value of superconductor layer 24, superconducting layer 24 remains superconductive. It is important to note that layer 26 is not necessarily limited to a superconducting material. In practice, any magnetic material may be used in which a magnetic field can be induced to control the superconducting of layer 24. In this instance, erasing layer 26 of magnetic flux would be accomplished by conventional means, such as passing a reverse current, if layer 26 is conductive, rather than by heating. Further, if layer 26 is magnetic but not conductive, insulating layer 28 will not be required.

In the embodiment shown in FIG. 6, the device can be read by determining the superconductivity state of superconducting layer 24. By applying a voltage across layer 24 and determining the current flow, a logic "1" or a logic "0" can be indicated. For example, when superconducting layer 24 is in a superconducting state, a high current may be detected indicating a state of "0". When superconducting layer 24 is in a normal conductivity state, a reduced current flow will be detected indicating a state of "1".

Although a preferred embodiment of the present invention has been described in detail, it should be understood that various changes, substitutions and alterations can be made herein without departing from the spirit and scope of the invention as defined by the appended claims.

What is claimed is:

1. A magnetic memory cell, comprising:

a layer of superconducting material; and a current path adjacent said layer of superconducting material, said current path operable to induce a magnetic field of selected orientation and magnitude in said layer of superconducting material and to heat said layer of superconducting material to a nonsuperconducting state by resistive heating.

2. The magnetic memory of claim 1, wherein said layer of superconducting material comprises a thin film of superconducting material.

3. The magnetic memory of claim 1, wherein said current path comprises the channel of a field effect transistor, and said memory cell consists of said field effect transistor.

4. The magnetic memory of claim 3, wherein said layer of superconducting material forms a gate of said field effect transistor.

5. The magnetic memory of claim 1, wherein said layer of superconducting material comprises a ring of superconducting material.

6. The magnetic memory cell of claim 1, wherein said current path comprises a layer of superconducting material.

7. A magnetic memory cell, comprising:

a layer of semiconductor of a first conductivity-type;

first and second source/drain regions formed in said layer of semiconductor to be of a second conductivity-type opposite said first conductivity-type, wherein said first and second source/drain regions are spaced by a channel area; and a film of superconducting material formed insulatively adjacent said channel;

wherein said channel area has higher resistivity for carrier conduction adjacent the interface of said channel area with insulated superconductor than for carrier conduction away from said interface.

8. The memory cell of claim 7, wherein said film is operable to control the conductivity of said channel.

9. The memory cell of claim 7, wherein said channel is operable to magnetize said film of superconducting material in a linear fashion from zero magnetic flux to a magnetic flux value equal to the magnetic field critical value of said film of superconducting material.

10. The magnetic memory cell of claim 7, wherein said film is formed as a ring.

11. The magnetic memory cell of claim 10, wherein said ring is operable to be magnetized in quantized values of magnetic flux.

12. The memory cell of claim 7, wherein said channel area comprises graded mobility material.

13. The memory cell of claim 12, wherein said channel area comprises a heterostructure of materials of varying mobilities.

14. A method for magnetically storing information, comprising:

heating a film of superconducting material above the transition temperature to erase any residual magnetic flux residing therein;

allowing the film to cool below the transition temperature;

passing a current through a current path adjacent the film to induce a magnetic flux in the film.

15. The method of claim 14, and further comprising the step of selecting the direction of current flow in the current path to thereby determine the orientation of the magnetic flux in the film.

16. The method of claim 14, and further comprising the step of preselecting the magnitude of the current passed through the adjacent film to thereby preselect the magnitude of the magnetic flux induced in the film.

17. A method of claim 14, wherein said step of heating comprises the step of passing a sufficient current through the current path to create resistive heat thereby raising the temperature the film above its transition temperature.

18. A method for magnetically storing information, comprising the steps of:

passing a first current through a channel of a field effect transistor to heat a layer of superconductor overlying the field effect transistor to a temperature above the superconductor transition temperature, thereby eliminating residual magnetic flux in the superconductor layer;

cooling the layer of superconductor below the transition temperature; and passing a second current through the channel of the field effect transistor to induce a magnetic field in the layer of semiconductor having a selected orientation and a selected magnitude.

19. The method of claim 18, wherein said step of passing a second current through the channel to induce a magnetic field comprises the steps of:

creating a first voltage difference between a first source/drain region of the transistor and a second source/drain of the transistor to induce a current flow from the first source/drain region to the second source/drain region to obtain in response a first orientation of the magnetic field in response to the current flow; and creating a second voltage difference between the first source/drain region and the second source/drain region to induce a current from said second source/drain region to obtain a second orientation of the magnetic field.

20. A method for magnetically storing and recalling information, comprising the steps of:

writing information into a layer of magnetic material disposed adjacent a layer of superconducting material by passing a current having a selected magnitude through the layer of superconducting material to induce a selected magnetic field in the magnetic material; and reading the information stored in the layer of magnetic material by determining the resistance of the layer of superconducting material.

21. The method of claim 20, wherein the current passed through the layer of superconducting material is selected to induce magnetic flux in the layer of magnetic material which exceeds the magnetic field critical value of the layer of superconducting material, thereby generating a substantial resistance in the layer of superconducting material representing a selected logic state.

22. The method of claim 20, and further comprising the step of cooling the layer of superconducting material below its transition temperature prior to said step of writing information.

23. The method of claim 22, and further comprising the steps of:

passing a selected current through the layer of superconducting material such that the superconducting material leaves the superconducting state thereby generating resistive heat; and in response to said substep of generating resistive heat, heating the film layer of superconducting material thereby eliminating residual magnetic flux therein.

* * * * *